United States Patent
Welsh et al.

(10) Patent No.: US 7,838,376 B2
(45) Date of Patent: Nov. 23, 2010

(54) NON-DESTRUCTIVE INLINE EPI PATTERN SHIFT MONITOR USING SELECTIVE EPI

(75) Inventors: Lynn S. Welsh, Lucas, TX (US); Amy E. Anderson, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 80 days.

(21) Appl. No.: 11/961,019

(22) Filed: Dec. 20, 2007

(65) Prior Publication Data

US 2009/0159983 A1 Jun. 25, 2009

(51) Int. Cl.
*H01L 21/331* (2006.01)
(52) U.S. Cl. ............... 438/341; 438/234; 438/236; 438/14; 257/E21.53; 257/E21.529
(58) Field of Classification Search ............... 438/14, 438/234, 341, 236; 257/E21.53, E21.529
See application file for complete search history.

(56) References Cited

U.S. PATENT DOCUMENTS

| | | | |
|---|---|---|---|
| 6,518,139 B1 * | 2/2003 | Aiello et al. | 438/322 |
| 2004/0154231 A1 * | 8/2004 | Lee et al. | 51/309 |
| 2005/0003308 A1 * | 1/2005 | Frohlich et al. | 430/313 |
| 2005/0056898 A1 * | 3/2005 | Kaneko et al. | 257/373 |
| 2007/0048928 A1 * | 3/2007 | Johansson et al. | 438/234 |

FOREIGN PATENT DOCUMENTS

JP 64-031413 * 2/1989

* cited by examiner

*Primary Examiner*—Thanh V Pham
*Assistant Examiner*—Maria Ligai
(74) *Attorney, Agent, or Firm*—Warren L. Franz; Wade J. Brady, III; Frederick J. Telecky, Jr.

(57) ABSTRACT

Integrated circuits using buried layers under epitaxial layers present a challenge in aligning patterns for surface components to the buried layers, because the epitaxial material over the buried layer diminishes the visibility of and shifts the apparent position of the buried layer. A method of measuring the lateral offset, known as the epi pattern shift, between a buried layer and a pattern for a surface component using planar processing technology and commonly used semiconductor fabrication metrology tools is disclosed. The disclosed method may be used on a pilot wafer to provide optimization data for a production line running production wafers, or may be used on production wafers directly. An integrated circuit fabricated using the instant invention is also disclosed.

21 Claims, 16 Drawing Sheets

NON-DESTRUCTIVE INLINE EPI PATTERN SHIFT MONITOR USING SELECTIVE EPI

FIELD OF THE INVENTION

This invention relates to the field of integrated circuits. More particularly, this invention relates to methods to improve pattern alignment to buried layers.

BACKGROUND OF THE INVENTION

Integrated circuits (ICs) frequently have buried layer conductive elements, such as n-type buried layers under circuits to reduce latchup. Such buried conductive elements are typically several microns below the surface of the IC substrate. Surface elements, such as deep wells, extend from the substrate surface and connect to the buried conductive elements. It is important that photolithographic patterns to define surface elements be aligned with the buried elements. Alignment of patterns with buried layers is difficult, due to a lack of clear features from the buried layers that are visible at the surface of the substrate. As lateral dimensions of structures in ICs shrink, as articulated by Moore's Law, the difficulty of alignment increases. Verification of alignment is a costly, time consuming and destructive process involving cross-sectioning a pilot wafer and measuring the alignment with a Scanning Electron Microscope (SEM).

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A method of measuring the lateral offset between a pattern for a surface component of an integrated circuit and a buried layer under an epitaxial layer in the integrated circuit, know as the epi pattern shift, using planar processing technology and commonly used semiconductor fabrication metrology tools is disclosed. The disclosed method may be used on a pilot wafer to provide optimization data for a production line running production wafers, or may be used on production wafers directly. An integrated circuit fabricated using the instant invention is also disclosed.

DETAILED DESCRIPTION

Figure 1A:
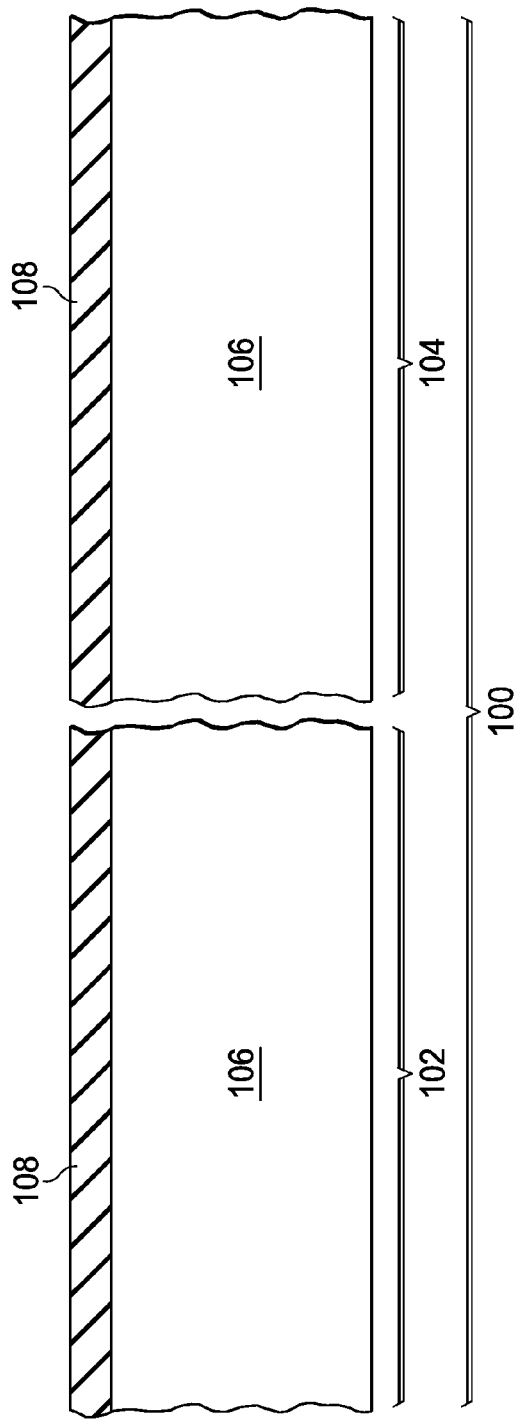
FIGS. 1A through 1Q are depictions of the process flow for a pilot wafer embodying the instant invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

For the purposes of this disclosure, the terms "N-type Buried Layer," (NBL), and "Diffusion Under Film," (DUF), are both taken to refer to an n-type region that is formed in a p-type integrated circuit substrate under a p-type epitaxial layer on the IC substrate. Polysilicon will be understood to mean poly crystalline silicon. Choline refers to an aqueous solution of choline hydroxide, $C_5H_{14}NO(OH)$, typically 3 to 10 percent in concentration.

The instant invention encompasses several embodiments. In a first embodiment, a pilot wafer undergoes a process sequence which enables a measurement of an epi pattern shift on commonly used semiconductor processing metrology equipment. FIGS. 1A through 1P are depictions of steps in the process sequence for a pilot wafer embodying the instant invention.

FIG. 1A is a cross-section of a pilot wafer after a process operation known as first oxide formation. Pilot wafer (100) includes two regions; an IC region (102) is reserved for fabricating ICs, and an epi pattern shift monitor region (104) is reserved for alignment marks related to an n-type buried layer and an n-well implant pattern. A single crystal substrate (106), typically p-type silicon, has a first oxide (108), typically silicon dioxide several hundred nanometers thick, deposited or grown on a top surface, typically by furnace oxidation.

Figure 1B:
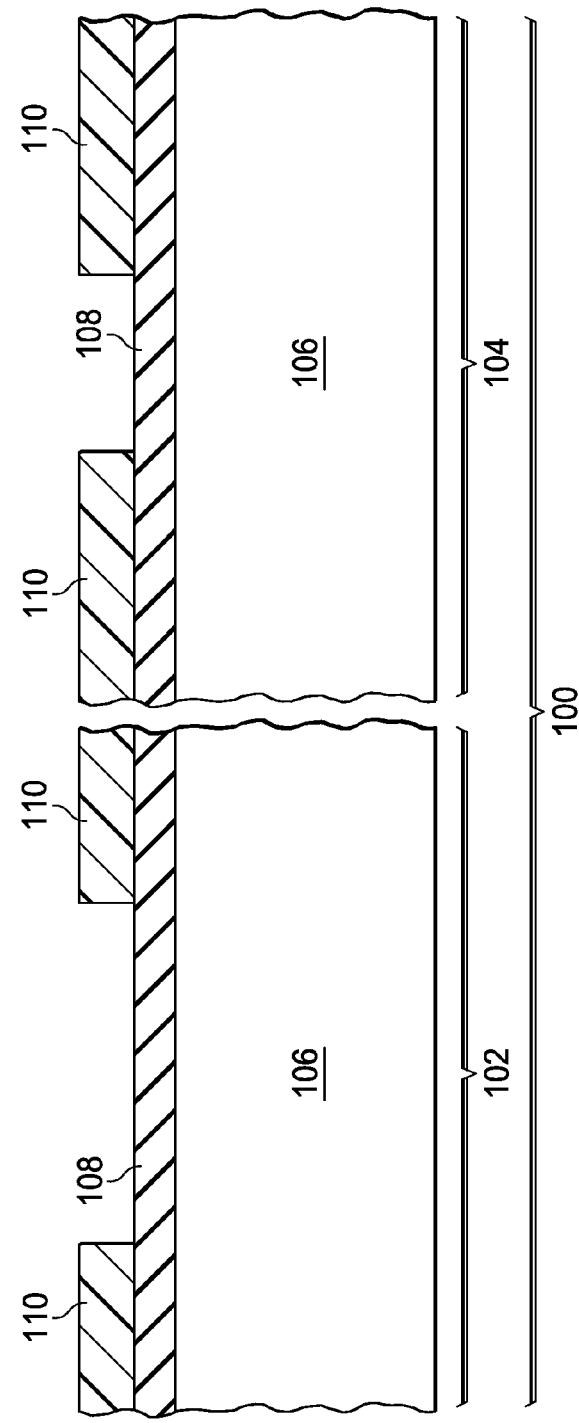

FIG. 1B is a cross-section of the wafer (100) with a photoresist pattern (110), sometimes called an NBL pattern, on a top surface of the first oxide (108) to define regions for an n-type buried layer. Both the IC region (102) and the epi pattern shift monitor region (104) have regions defined for the n-type buried layer.

Figure 1C:
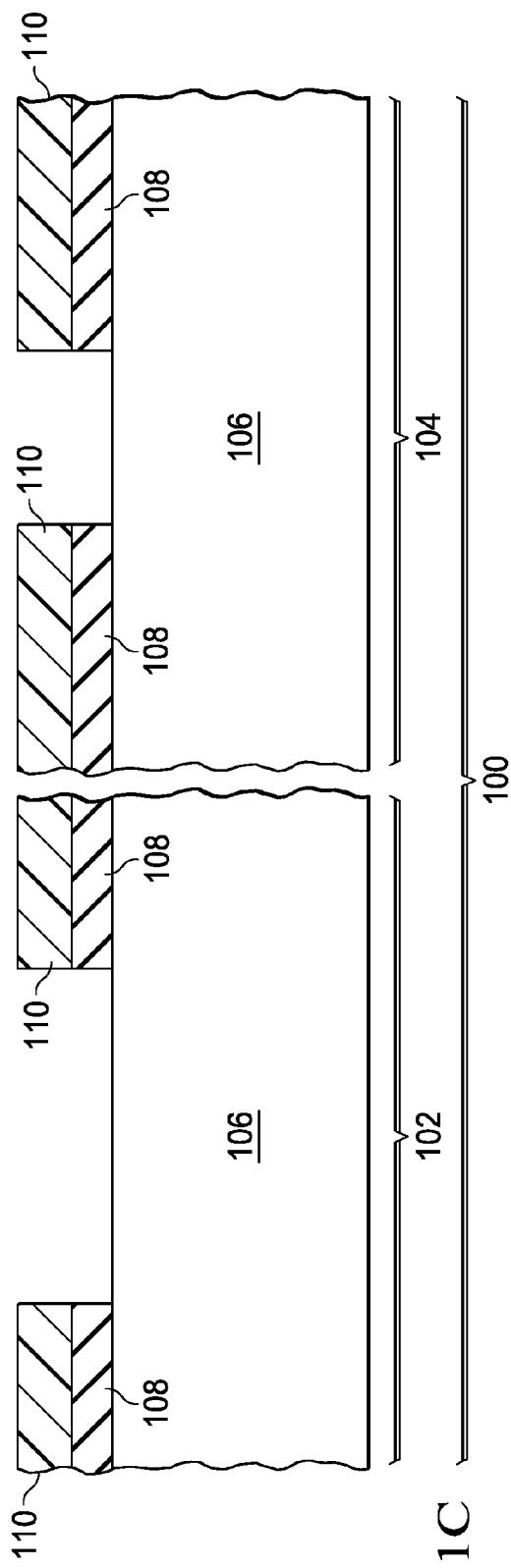

FIG. 1C is a cross-section of the wafer (100) with the NBL pattern (110), after an oxide etch process operation, known as a DUF Dry Etch. Portions of the first oxide (108) in the regions defined for the n-type buried layer by the NBL pattern (110) have been removed by the oxide etch process, exposing a top surface of the substrate (106).

Figure 1D:
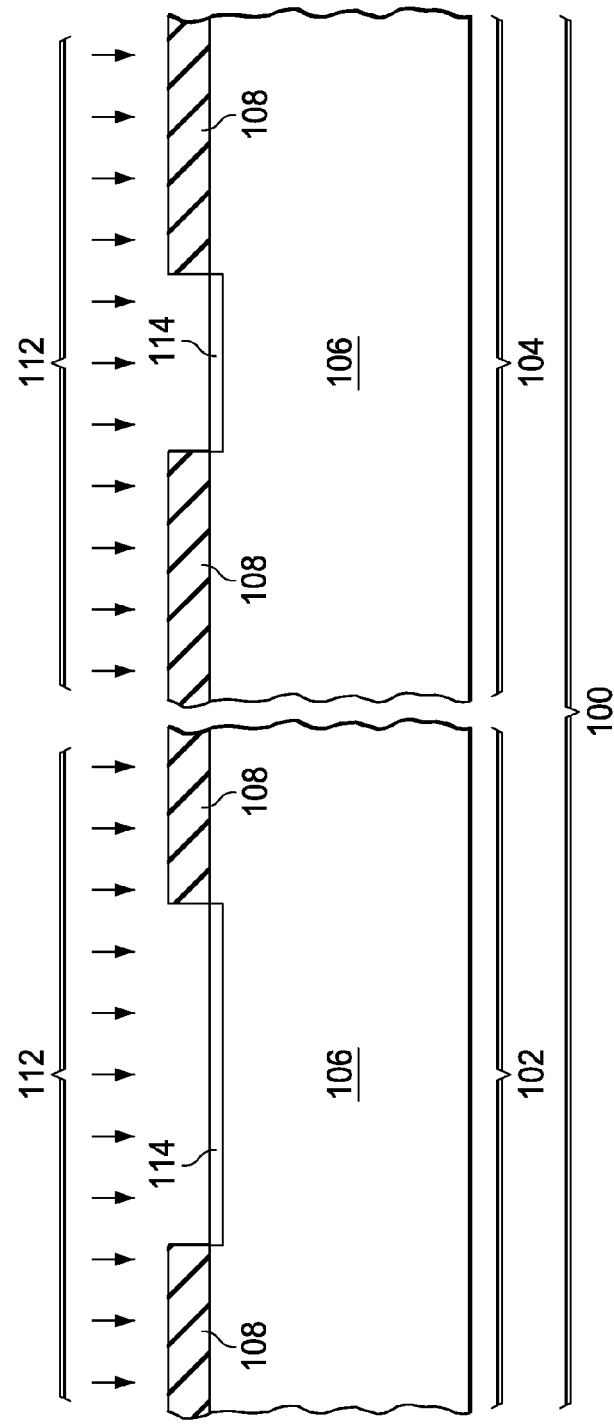

FIG. 1D is a cross-section of the wafer (100) during an ion implantation process operation, known as NBL implant. The photoresist of the NBL pattern has been removed prior to this operation. N-type dopant ions (112), typically antimony, are implanted into a top portion of the substrate (106) in regions defined by the open regions in the first oxide (108), to form an as-implanted n-type layer (114).

Figure 1E:
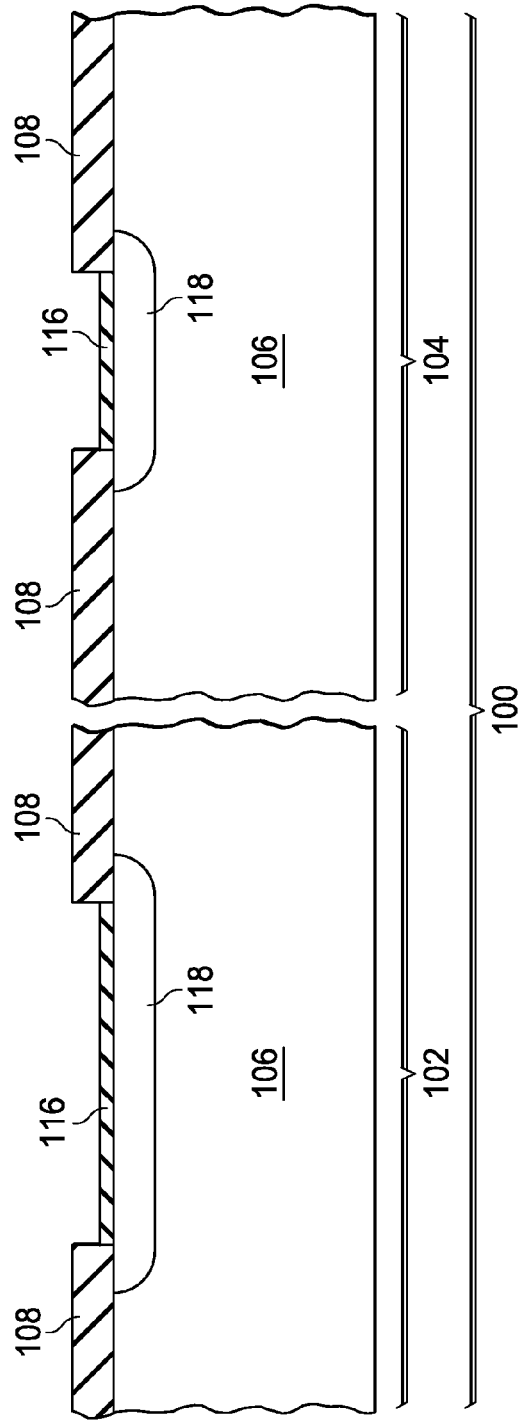

FIG. 1E is a cross-section of the wafer (100) after an anneal operation, known as a DUF diffusion, to reduce damage to the substrate by the n-type dopants that were implanted, as discussed in reference to FIG. 1D. A layer of silicon dioxide (116) has grown in exposed regions on the top surface of the substrate (106). The n-type region (118) has expanded during the anneal operation by diffusion of the dopant atoms.

Figure 1F:
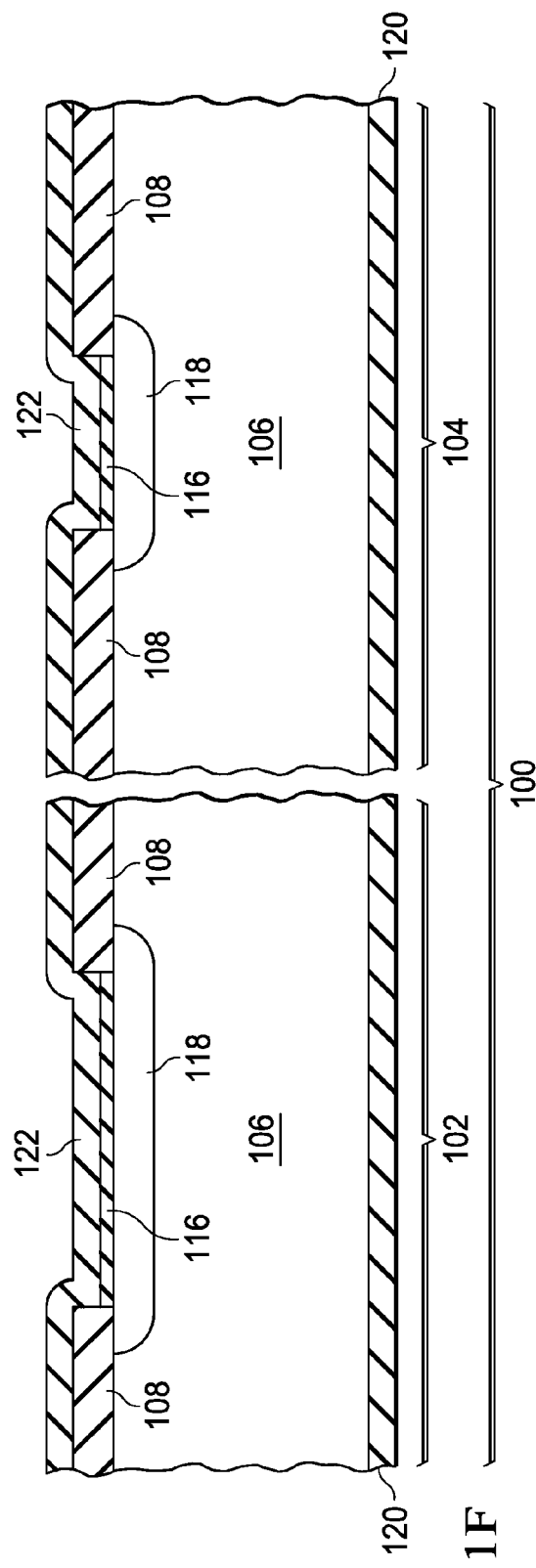

FIG. 1F is a cross-section of the wafer (100) after a process operation, known as nitride deposition, to deposit silicon nitride on a back surface of the wafer (100). A silicon nitride layer (120) has been formed on the back surface of the wafer.

Similarly, a silicon nitride layer (122) has been formed on a top surface of the first oxide (108) and a top surface of the oxide (116) grown during the anneal operation discussed in reference to FIG. 1E.

Figure 1G:
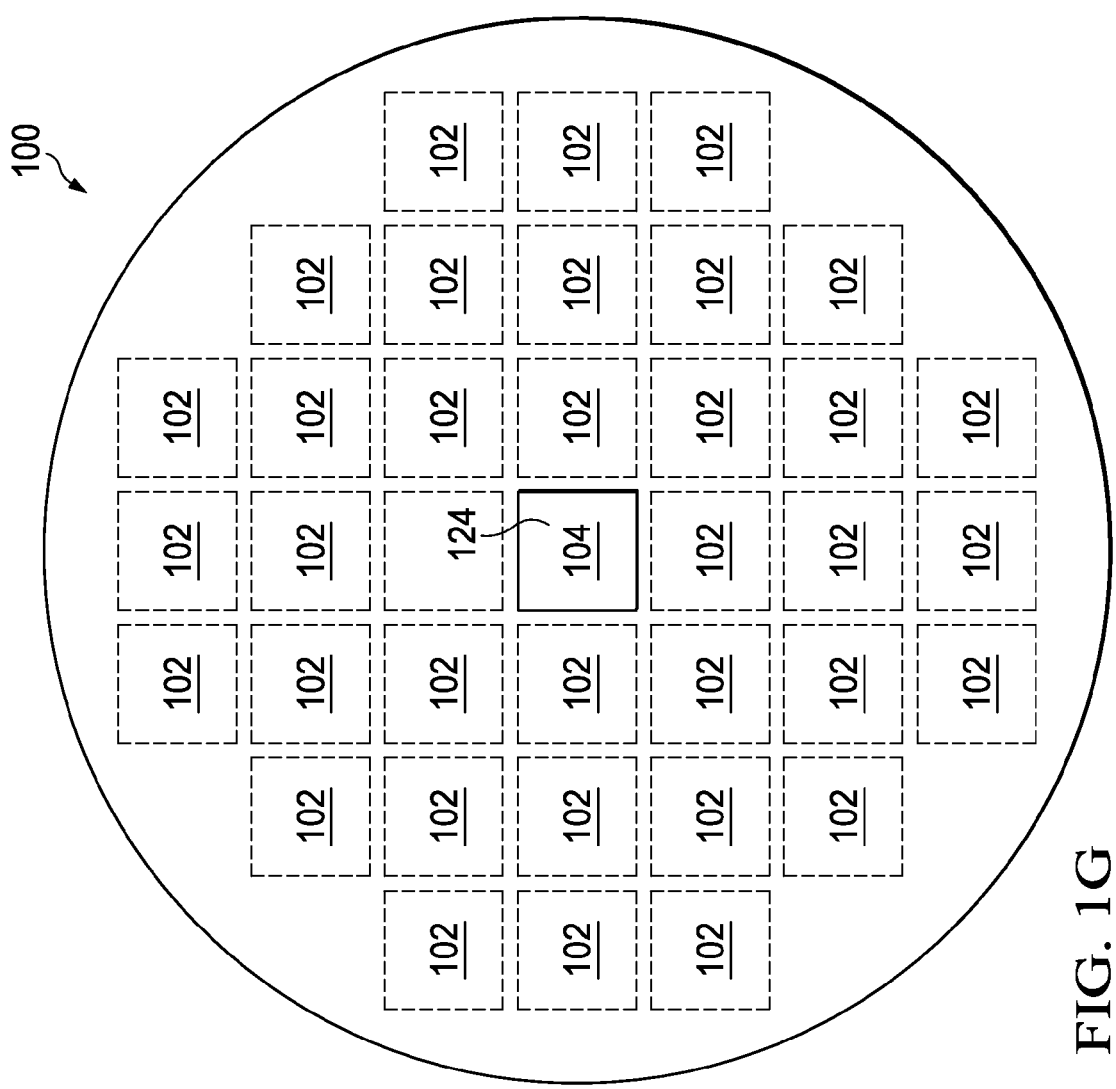

FIG. 1G is a top view of the wafer (100) showing relative locations of IC regions (102) and the epi pattern shift monitor region (104), after a photolithographic operation to cover the epi pattern shift monitor region (104) with photoresist (124). It is within the scope of the instant invention to locate the epi pattern shift monitor region (104) in any site on the front surface of the wafer (100). It is also within the scope of the instant invention to have a plurality of regions reserved for epi pattern shift monitoring.

Figure 1H:
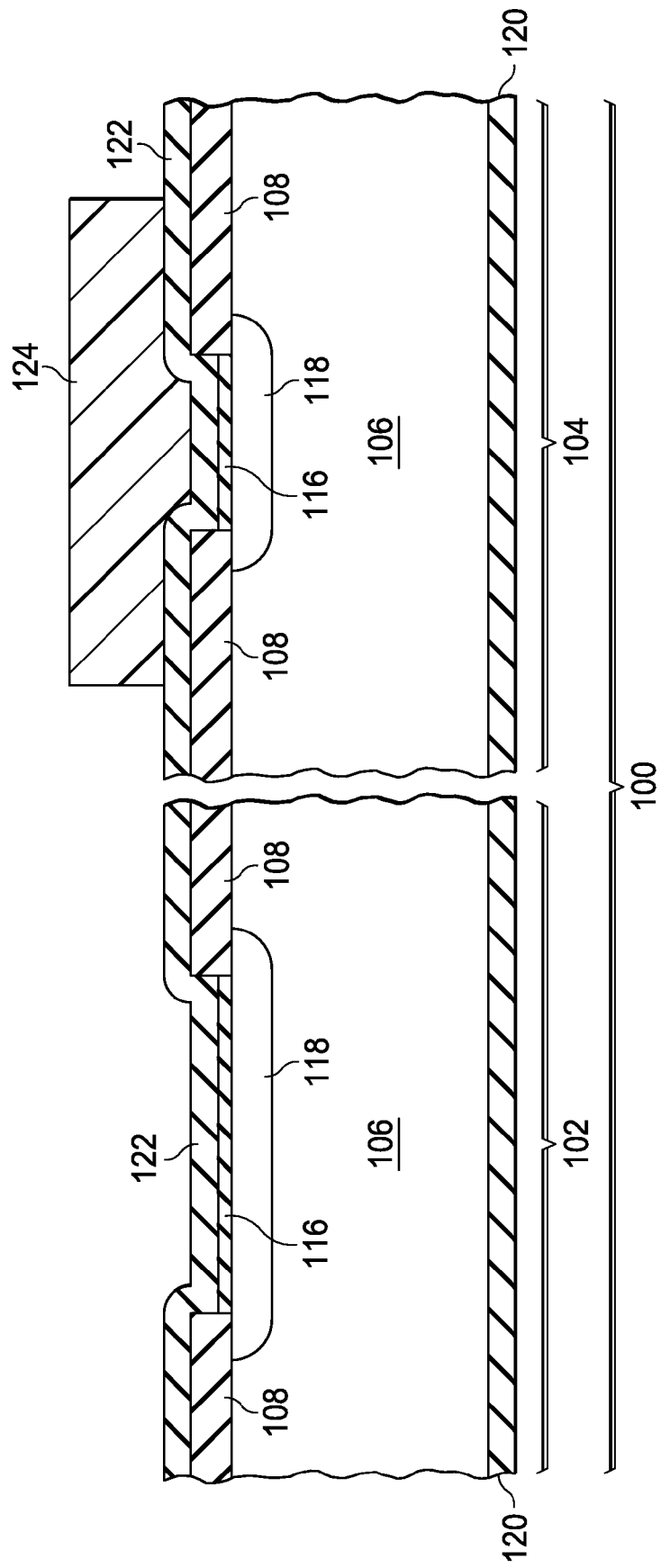

FIG. 1H is a cross-section of the wafer (100) after the photolithographic operation to cover the epi pattern shift monitor region (104) with photoresist (124), discussed above in reference to FIG. 1G. Photoresist (124) covers the region reserved for the epi pattern shift monitor.

Figure 1I:
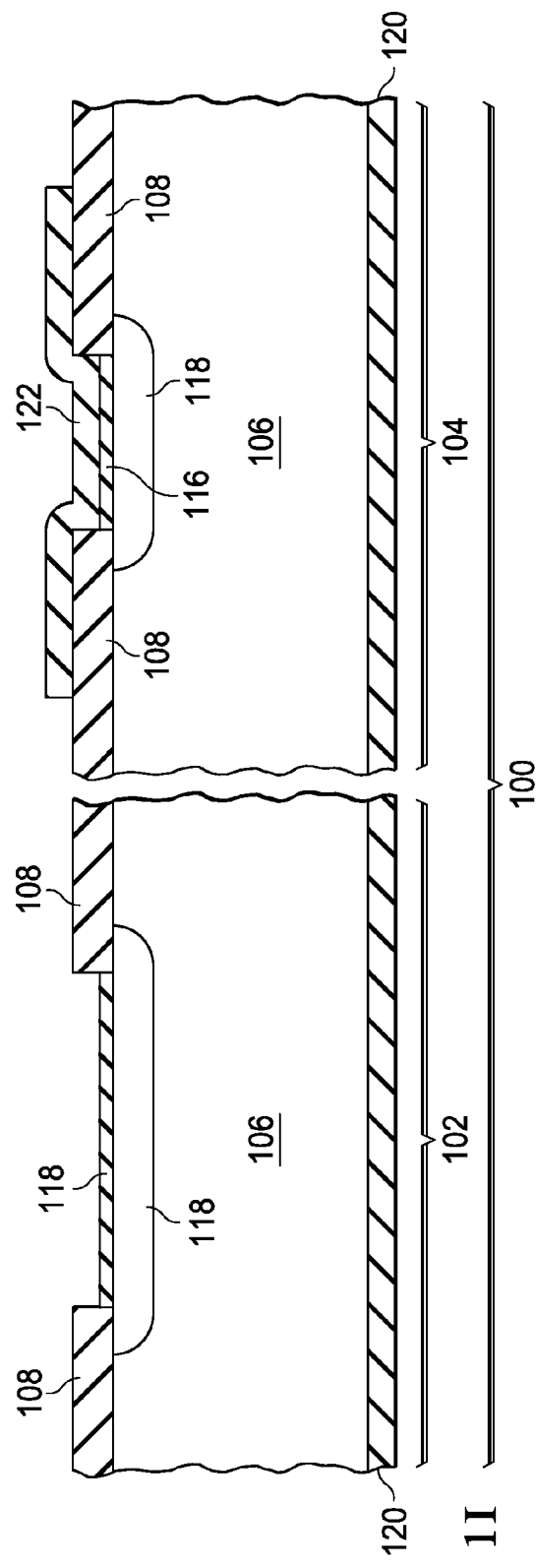

FIG. 1I is a cross-section of the wafer (100) after an operation known as a nitride etch operation. Silicon nitride on the front surface of the wafer (100) has been removed except where masked in the epi pattern shift monitor region (104) by the photoresist applied in the photolithographic operation discussed in reference to FIG. 1H and FIG. 1G. After the silicon nitride was etched, the photoresist was removed.

Figure 1J:
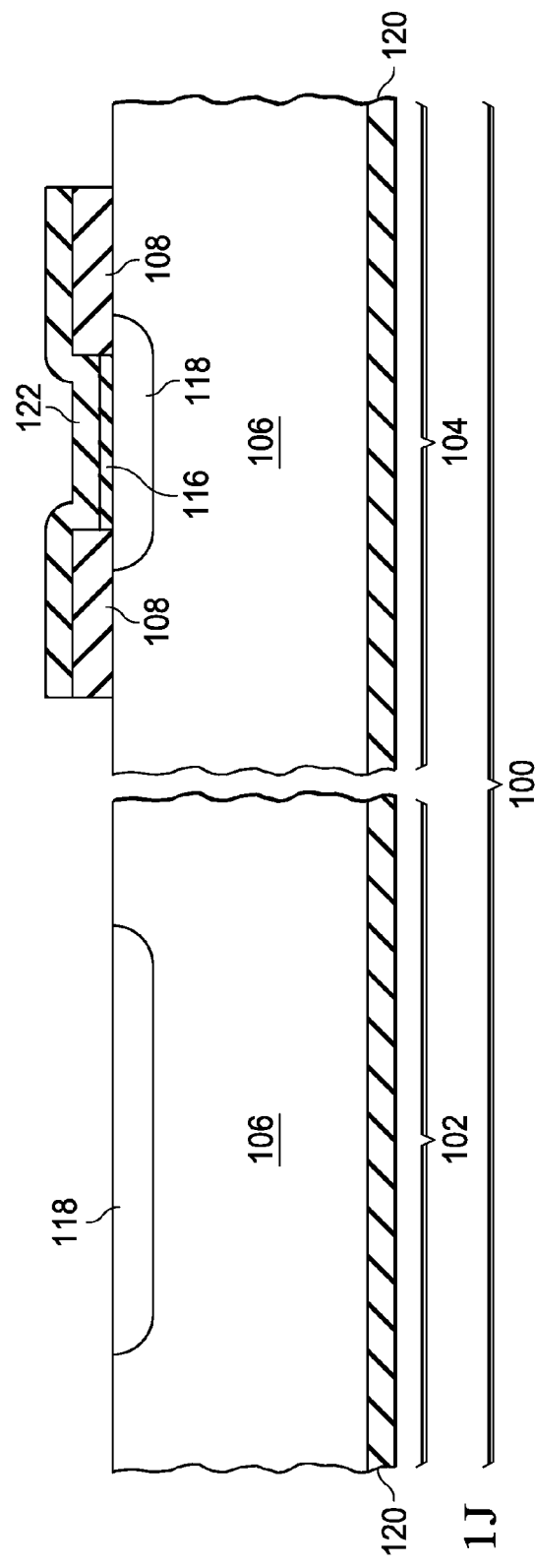

FIG. 1J is a cross-section of the wafer (100) after an operation known as an oxide etch operation. During this operation, the first oxide (108) and the oxide (116) grown during the anneal operation discussed in reference to FIG. 1E were removed from the front surface of the wafer (100), except where masked in the epi pattern shift monitor region (104) by the silicon nitride (122).

Figure 1K:
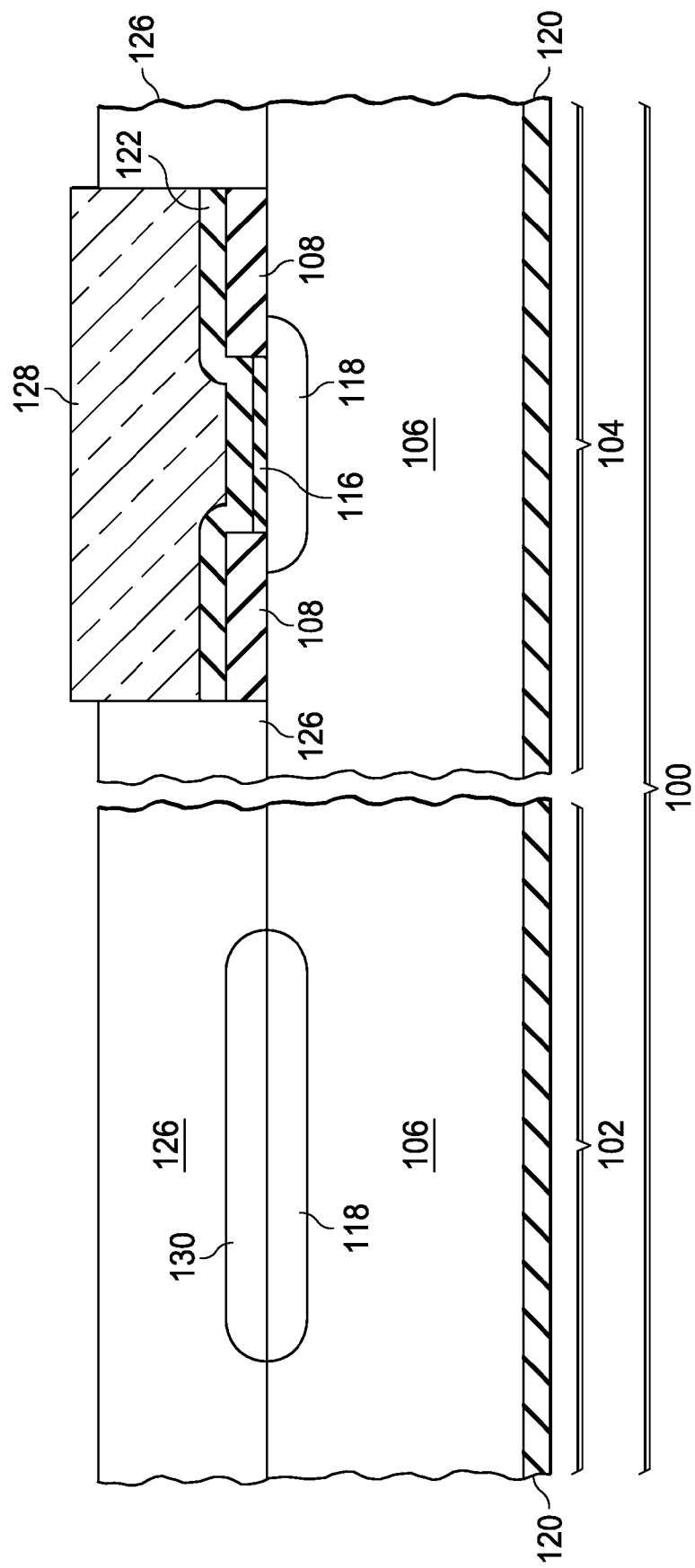

FIG. 1K is a cross-section of the wafer (100) after an epitaxial layer growth operation. An epitaxial layer of single crystal p-type silicon (126), typically several microns thick, has been grown on the top surface of the substrate (106), except where masked in the epi pattern shift monitor region (104) by oxide (108, 116) and silicon nitride (122). During the epitaxial layer growth operation, polysilicon is grown on a top surface of the silicon nitride (122). N-type dopants from the n-type regions (118) diffuse into the epitaxial layer (126) during its growth to form an expanded n-type buried layer (130), except where masked in the epi pattern shift monitor region (104) by oxide (108, 116) and silicon nitride (122).

Figure 1L:
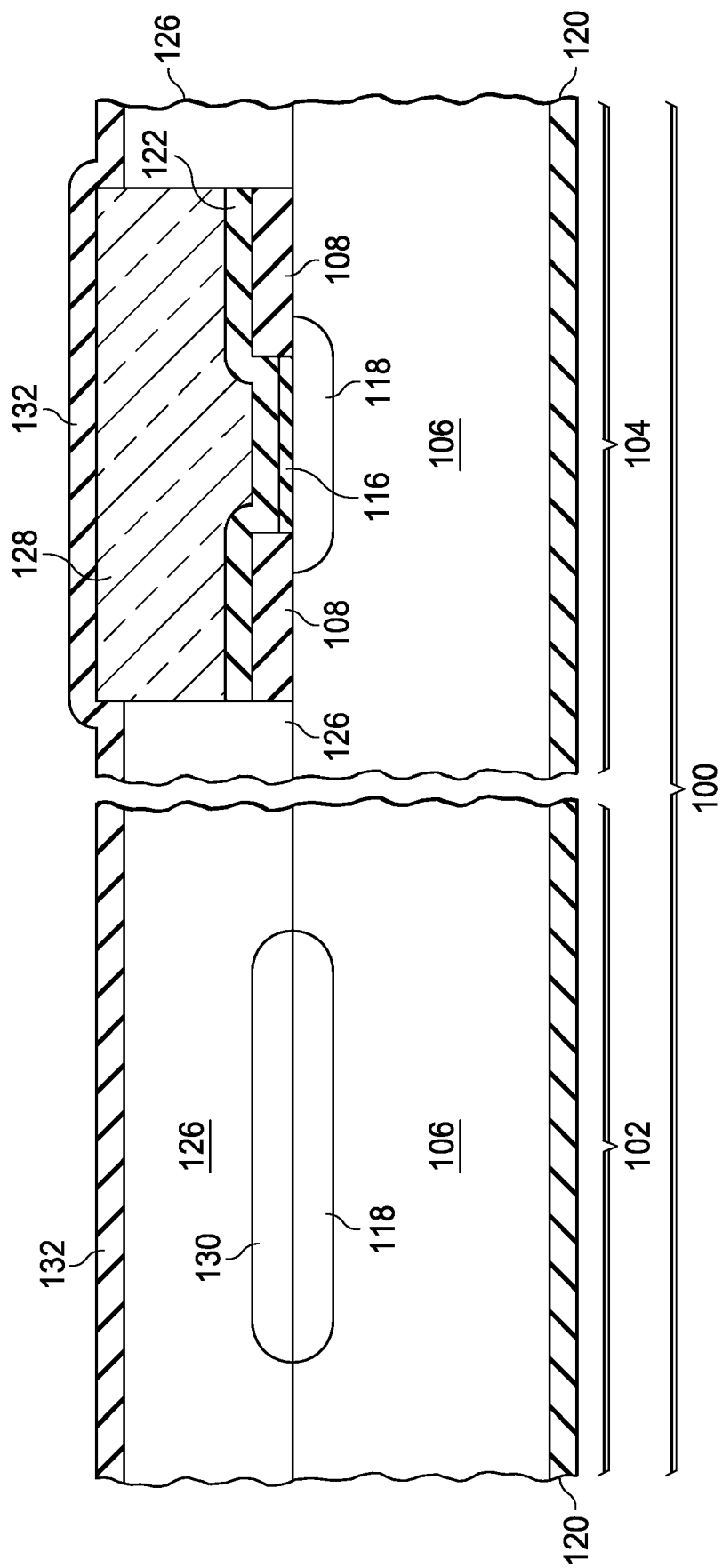

FIG. 1L is a cross-section of the wafer (100) after a deposition of an oxide layer, known as an Nwell oxide. An Nwell oxide layer (132), typically silicon dioxide, is deposited, typically by a plasma process, on a top surface of the epitaxial layer (126) and a top surface of the polysilicon layer (128).

Figure 1M:
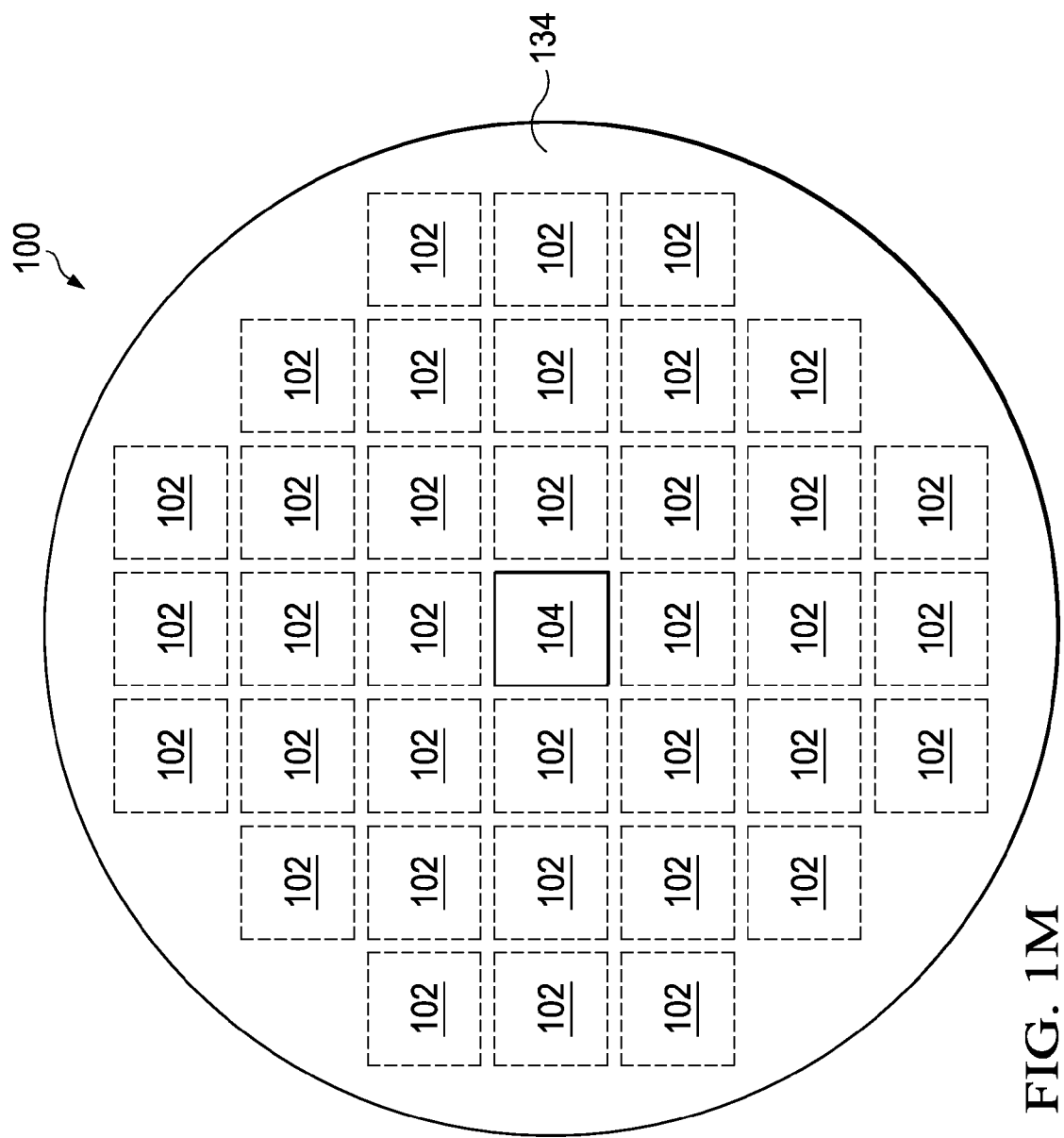

FIG. 1M is a top view of the wafer (100) after a photolithographic operation to expose the epi pattern shift monitor region (104) while covering the IC regions (102) with photoresist (134).

Figure 1N:
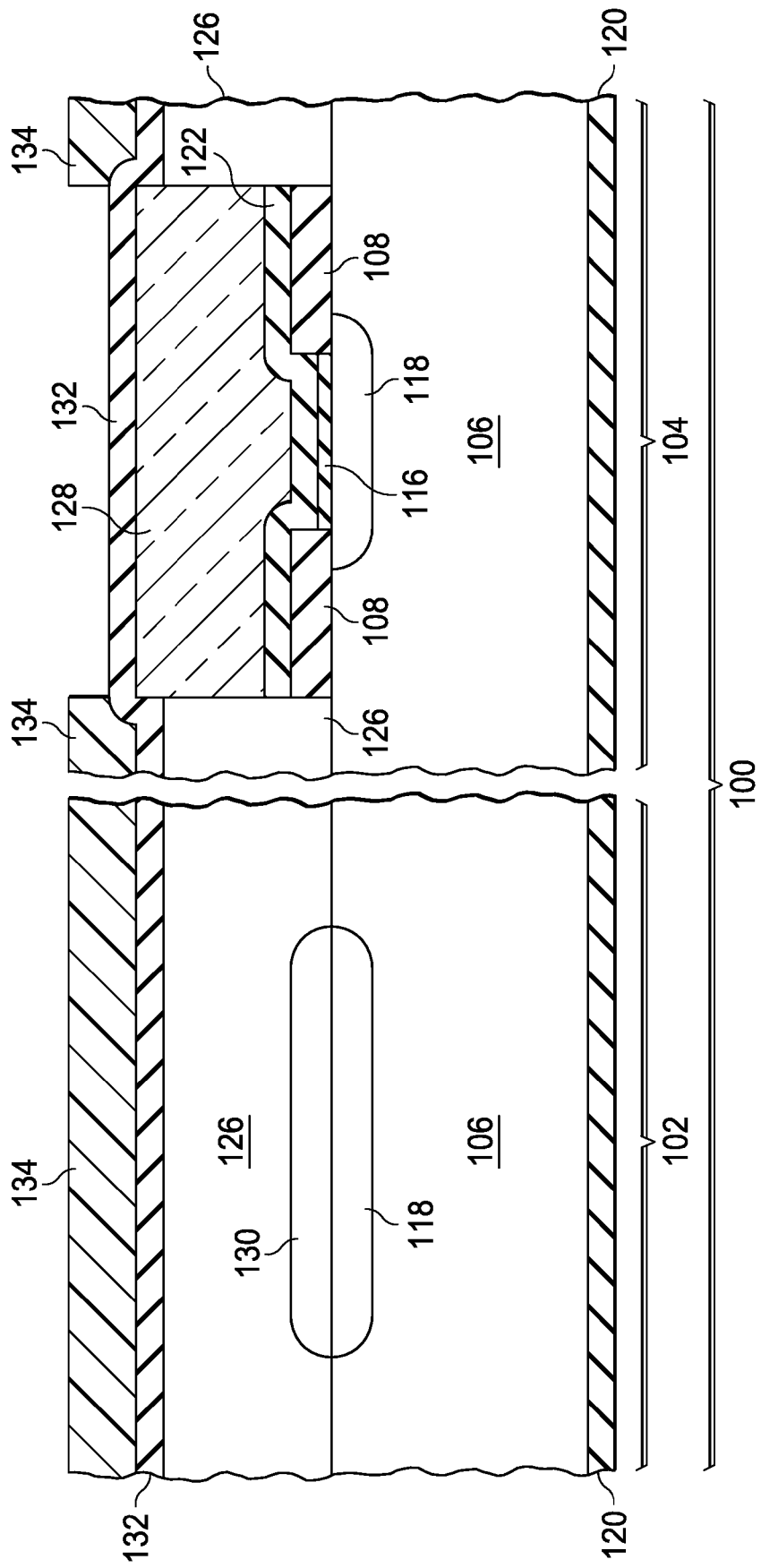

FIG. 1N is a cross-section of the wafer (100) after the photolithographic operation to expose the epi pattern shift monitor region (104) while covering the IC regions (102) with photoresist (134), discussed above in reference to FIG. 1M. Photoresist (134) covers the regions reserved for ICs. Nwell Oxide (132) over polysilicon (128) is exposed.

Figure 1O:
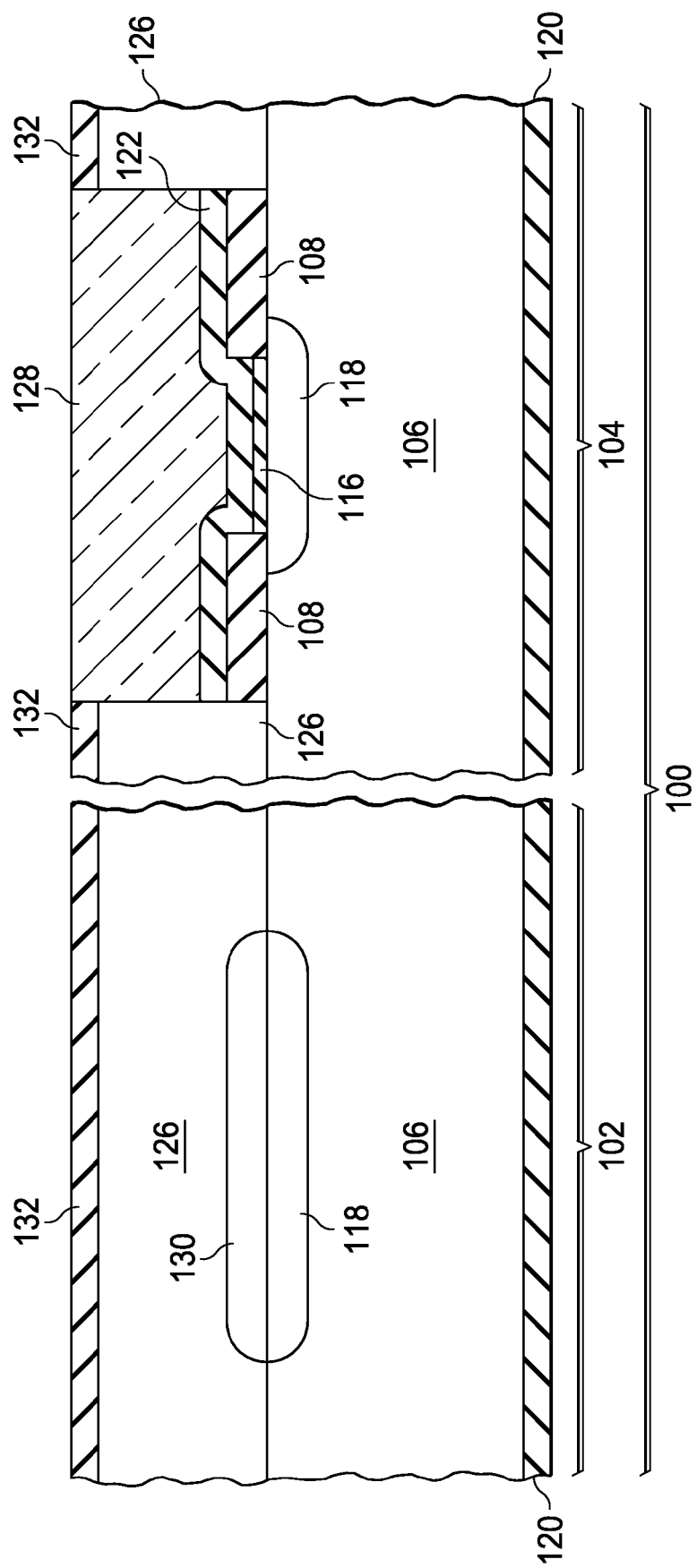
Figure 1P:
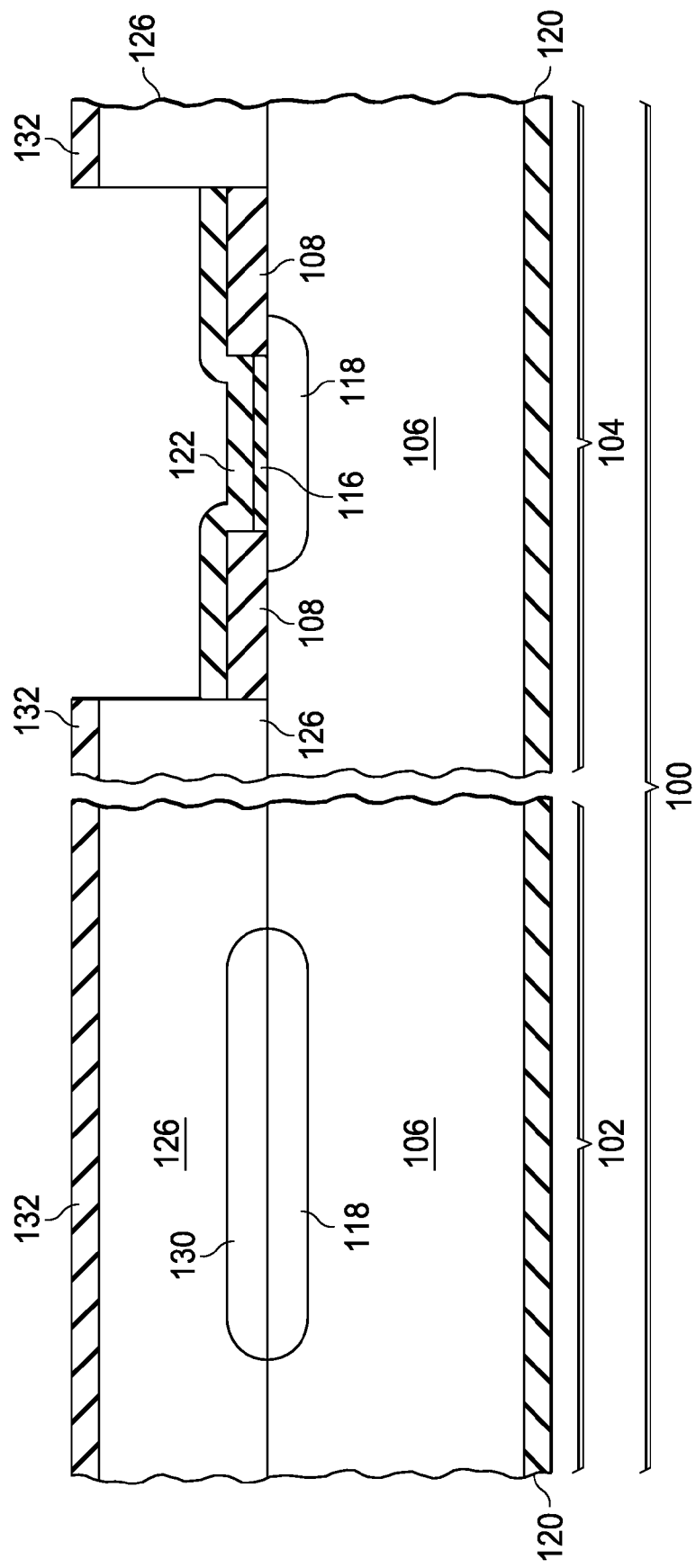

FIG. 1O is a cross-section of the wafer (100) after an Nwell oxide etch process. Portions of Nwell oxide layer (132) have been removed in the epi pattern shift monitor region (104), where not masked by the photoresist applied in the photolithographic operation discussed in reference to FIG. 1M and FIG. 1N. The polysilicon (128) is exposed after the Nwell oxide etch process.

FIG. 1P is a cross-section of the wafer (100) after a choline etch. Wafer (100) is exposed to a choline wet etch, which removes the polysilicon over the silicon nitride (122). The epitaxial layer (126) is protected from the choline etch by the Nwell oxide layer (132). The silicon nitride (122) is exposed after the choline etch.

Figure 1Q:
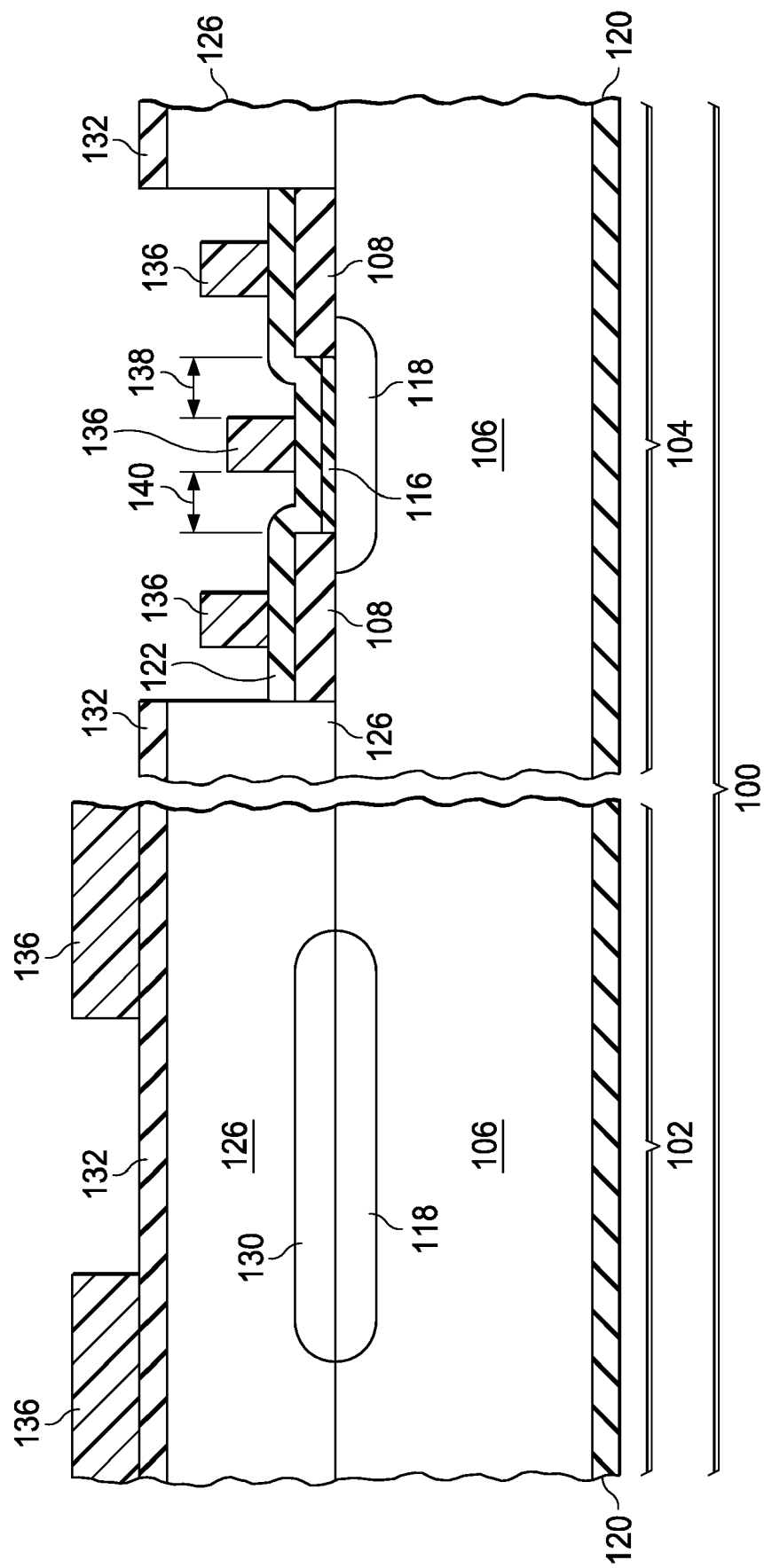

FIG. 1Q is a cross-section of the wafer (100) after a photolithographic operation to define regions for an n-type ion implant, known as an n-well implant. An n-well implant pattern generated by this photolithographic operation must be aligned to the n-type buried layer (118). It is an embodiment of the instant invention that the lateral misalignment of the n-well implant pattern to the n-type buried layer may be measured on commonly used semiconductor processing metrology equipment. Photoresist of the n-well pattern (136) is present on a top surface of the Nwell oxide (132) in the IC regions (102) and on the top surface of the silicon nitride (122). Commonly used semiconductor processing metrology equipment can measure and report a right NBL to n-well pattern spacing (138) and a left NBL to n-well pattern spacing (140). An epi pattern shift value may be computed using the following expression:

$$Epi \text{ pattern shift} = \frac{(\text{right } NBL \text{ to } nwell \text{ spacing}) - (\text{left } NBL \text{ to } nwell \text{ spacing})}{2} \quad (1)$$

The value of the epi pattern shift obtained from EQN. 1 is used to adjust the photolithographic operation to generate the pattern for the n-well to optimize the alignment to the n-type buried layer. This embodiment is advantageous because the time and cost to measure the epi pattern shift is much less than commonly used procedures such as cross-sectioning followed by examination in a scanning electron microscope (SEM).

Figure 2A:
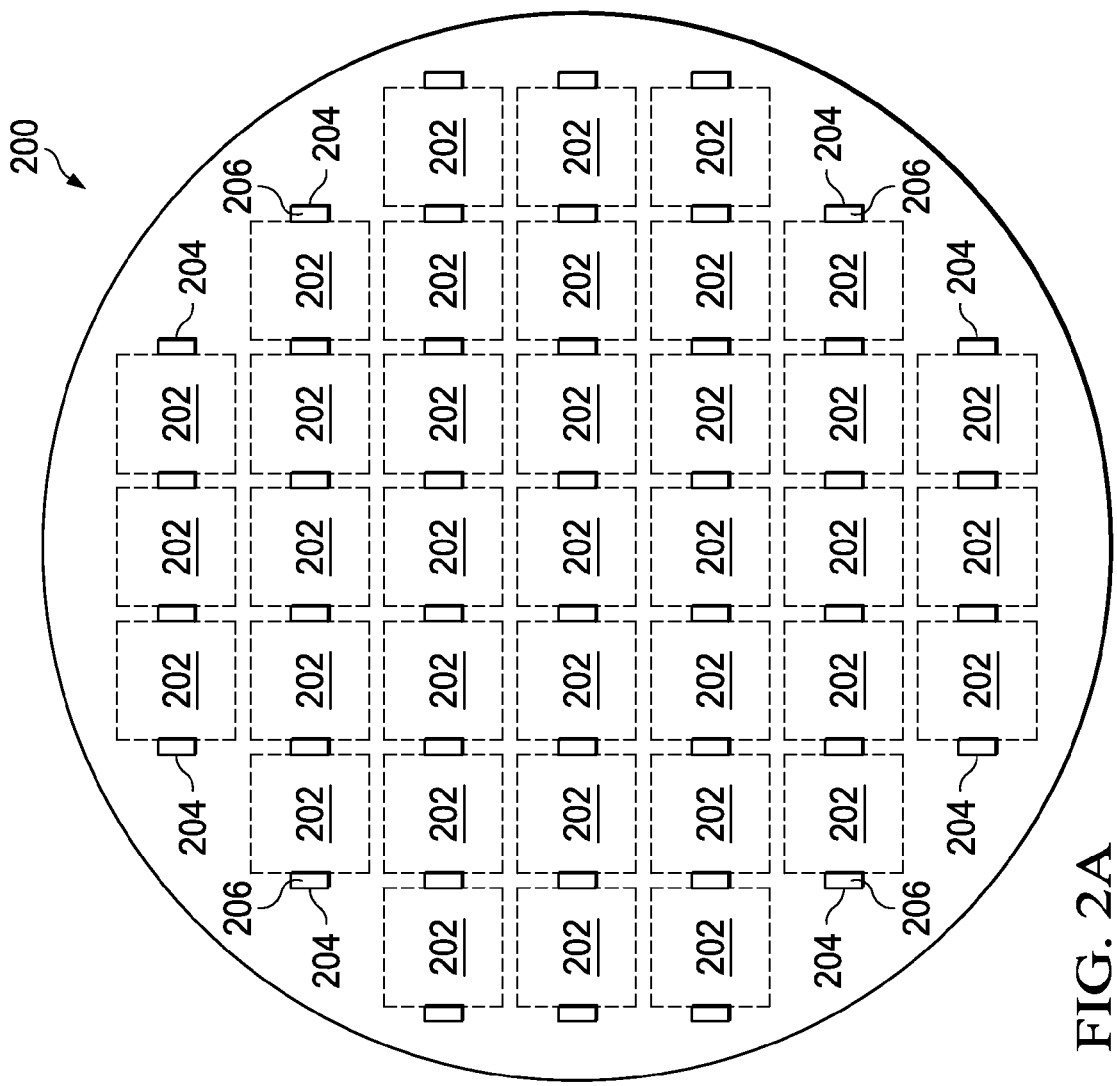
FIG. 2A and FIG. 2B are top views of a wafer fabricated according to another embodiment of the instant invention.
Figure 2B:
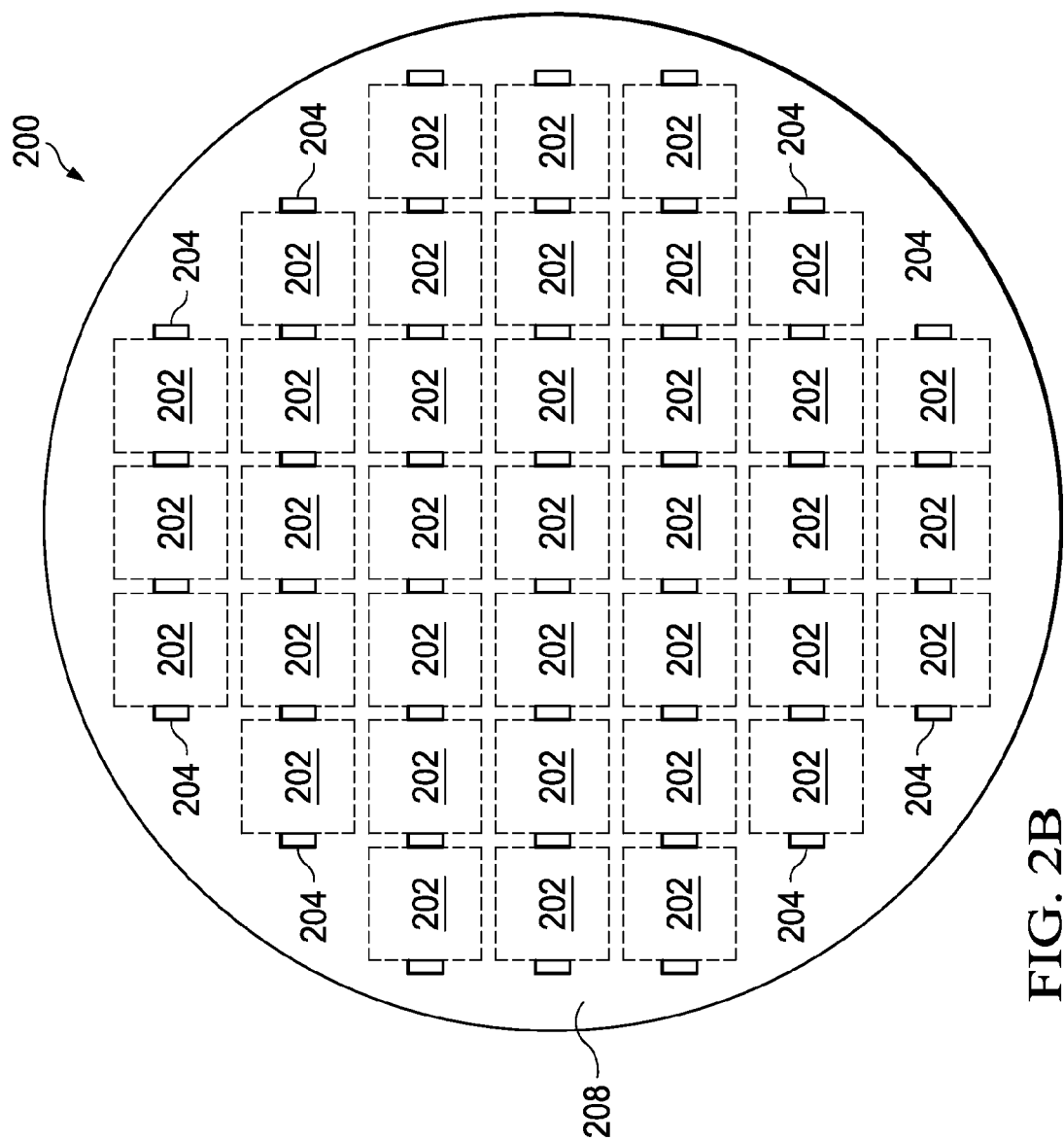

In another embodiment, an n-well pattern may be aligned directly to an n-type buried layer pattern monitor on a wafer, and the wafer may be continued through an IC fabrication process sequence to produce completed ICs in which n-well to n-type buried layer alignment is optimized. FIG. 2A and FIG. 2B depict a wafer with a plurality of regions reserved for n-type buried layer pattern monitors.

FIG. 2A depicts a wafer (200) with a plurality of regions (202) reserved for ICs and a plurality of regions (204) reserved for n-type buried layer pattern monitors. The wafer (200) has been through the following process operations, similar to those discussed in reference to FIGS. 1A through 1F above, including first oxide formation, n-buried layer pattern, DUF wet etch, NBL implant, DUF diffusion and backside nitride deposition. After the backside nitride deposition operation, the wafer (200) undergoes a photolithographic operation to cover the n-type buried layer pattern monitor regions (204) with photoresist (206). It is within the scope of the instant embodiment to have a number of regions (204) reserved for n-type buried layer pattern monitors that is less than, equal to, or greater than the number of regions (202) reserved for ICs. The wafer (200) undergoes a nitride etch operation, similar to that discussed in reference to FIG. 1I. After the nitride etch operation is complete, regions (204) reserved for n-type buried layer pattern monitors have a silicon nitride layer over them, due to masking by the photoresist, while regions (202) reserved for ICs have no silicon nitride over them. The wafer (200) undergoes an oxide etch operation, similar to that discussed in reference to FIG. 1J. After the oxide etch operation is complete, regions (204)

reserved for n-type buried layer pattern monitors have a silicon nitride layer and silicon dioxide layer over them, due to masking by the silicon nitride, while regions (202) reserved for ICs have no silicon dioxide over them. The wafer (200) undergoes an epitaxial layer growth operation, in which a single crystal epitaxial layer of p-type silicon is grown on the exposed substrate material in the regions (202) reserved for ICs, while polysilicon grows on the silicon nitride over the regions (204) reserved for the n-type buried layer pattern monitors. A layer of Nwell oxide is deposited on a top surface of the epitaxial layer and a top surface of the polysilicon. Referring to FIG. 2B, after the Nwell oxide deposition operation, the wafer (200) undergoes a photolithographic operation to cover the regions (202) reserved for ICs with photoresist (208) and expose the regions (204) reserved for the n-type buried layer pattern monitors to subsequent etching. While the photoresist (208) is on the wafer (200), the wafer (200) undergoes an oxide etch operation in which Nwell oxide that is exposed by the photolithographic operation is removed. Thus, the Nwell oxide is removed over the regions (204) reserved for the n-type buried layer pattern monitors, while it remains over the regions (202) reserved for ICs. After the oxide etch operation, the photoresist (208) is removed and the wafer (100) undergoes a choline etch operation, in which the polysilicon is removed. The single crystal epitaxial layer is protected from the choline etch by the Nwell oxide on its top surface. After the choline etch operation, the wafer resumes IC fabrication with a photolithographic operation to define regions for n-well ion implants. In this embodiment, the n-well pattern is aligned directly to the n-type buried layer monitors. This is advantageous because the alignment of the n-well to the n-type buried layer is optimized for each wafer using the instant embodiment. The effect of random variations from wafer to wafer in the epi pattern shift are eliminated from the n-well to n-type buried layer alignment.

Figure 3:
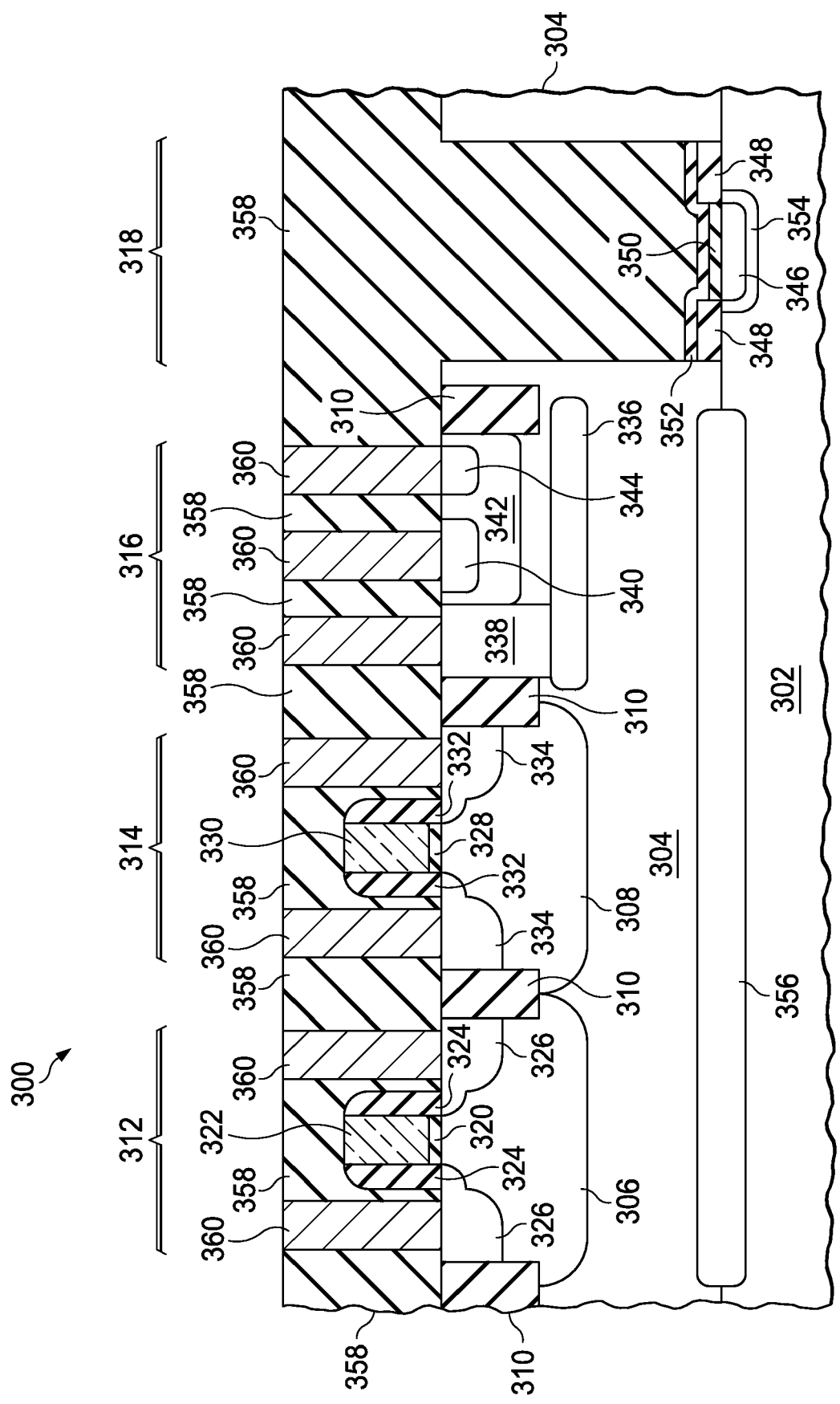
FIG. 3 is a cross-section of an integrated circuit containing MOS transistors, a buried collector bipolar transistor and an n-type buried layer monitor according to an embodiment of the instant invention.

The embodiment discussed in reference to FIGS. 2A and 2B may be implemented on any wafers with any integrated circuits containing n-type buried layers. FIG. 3 is a cross-section of an integrated circuit containing MOS transistors, a buried collector bipolar transistor and an n-type buried layer monitor according to an embodiment of the instant invention. Integrated circuit (300) includes a p-type substrate (302), on which is formed a p-type epitaxial layer (304), an n-well (306), a p-well (308) and regions of field oxide (310), typically silicon dioxide formed by Local Oxidation of Silicon (LOCOS) or Shallow Trench Isolation (STI), in the epitaxial layer (304) to isolate components. A p-channel MOS (PMOS) transistor (312) is formed in the n-well (306), and an n-channel MOS (NMOS) transistor (314) is formed in the p-well (308). A buried collector npn bipolar transistor (316) is formed in the epitaxial layer (304). An n-type buried layer monitor (318) is formed in the substrate (302). The PMOS transistor (312) includes a PMOS gate dielectric (320), typically silicon dioxide, silicon oxy-nitride, or hafnium oxide, a PMOS gate (322), typically polysilicon, PMOS gate sidewall spacers (324), typically silicon nitride or layers of silicon nitride and silicon dioxide, and p-type source and drain regions (326). The NMOS transistor (314) includes an NMOS gate dielectric (328), typically silicon dioxide, silicon oxy-nitride, or hafnium oxide, an NMOS gate (330), typically polysilicon, NMOS gate sidewall spacers (332), typically silicon nitride or layers of silicon nitride and silicon dioxide, and n-type source and drain regions (334). The buried collector npn bipolar transistor (316) includes an n-type buried layer (336), formed by implantation of n-type dopants, typically antimony, into the substrate (302), a deep n-well (338) connecting the n-type buried layer (336) with a top surface of the epitaxial layer (304), an n-type emitter diffused region (340) in the epitaxial layer (304), a p-type base region (342), and a p-type base contact diffused region (344). The n-type buried layer monitor (318) includes an n-type buried layer region (346), a first layer of silicon dioxide (348) outside the n-type buried layer region (346), a second layer of silicon dioxide (350) over the n-type buried layer region (346), formed during an anneal of the n-type buried layer implant, a layer of silicon nitride (352) on top surfaces of the first and second layers of silicon dioxide (348, 350), and an n-well region (354), the pattern for which was aligned to the n-type buried layer monitor (318). An n-type buried layer (356) is formed under the PMOS transistor (312), the NMOS transistor (314) and the buried collector npn bipolar transistor (316), in the substrate (302) and diffuses partway into the epitaxial layer (304). A pre-metal dielectric (PMD) layer (358) is formed on top of the PMOS transistor (312), the NMOS transistor (314), the buried collector npn bipolar transistor (316) and the n-type buried layer monitor (318). Contacts (360), typically tungsten, are formed in the PMD layer (358) to connect the PMOS transistor (312), the NMOS transistor (314) and the buried collector npn bipolar transistor (316) to other components in the integrated circuit (300).

What is claimed is:

1. A method of fabricating an integrated circuit, comprising:

providing a substrate;

forming a first mask with a buried layer pattern over the substrate;

forming first and second buried layers in the substrate by implanting dopant through the first mask;

forming a layer of insulating material over the substrate over the second buried layer and not over the first buried layer;

forming an epitaxial layer over the substrate over the first buried layer, and over the layer of insulating material over the second buried layer;

selectively removing the epitaxial layer from over the layer of insulating material over the second buried layer, leaving the epitaxial layer over the first buried layer;

after selectively removing the epitaxial layer, forming a second mask with a well pattern over the epitaxial layer over the first buried layer and over the layer of insulating material over the second buried layer; and determining an alignment of the well pattern with the first buried layer by measuring an alignment of the well pattern with the second buried layer.

2. The method of claim 1, wherein forming the first mask comprises forming a hard mask layer over the substrate and forming first and second openings in the hard mask layer; the first and second buried layers are formed by implanting the dopant respectively through the first and second openings; the hard mask layer is selectively removed from over the first buried layer, leaving the hard mask layer and second opening over the second buried layer; and the alignment of the well pattern with the second buried layer is determined by alignment of the well pattern with the second opening.

3. The method of claim 2, wherein the layer of insulating material is formed over the hard mask layer within the second opening; and the alignment of the well pattern with the second buried layer is determined by alignment of the well pattern with the layer of insulating material formed in the second opening.

4. The method of claim 3, wherein the hard mask layer comprises an oxide.

5. The method of claim 3, wherein the alignment of the well pattern with the second opening is determined by measuring a first distance between the well pattern and an edge of the second opening; measuring a second distance between the well pattern and an opposite edge of the second opening; and determining the alignment from an average of the first and second distances.

6. The method of claim 1, further comprising adjusting an alignment of another second mask with the well pattern based on determining the alignment of the second mask well pattern.

7. The method of claim 6, further comprising providing a second substrate;
forming another first mask with the buried layer pattern over the second substrate; forming another buried layer in the second substrate by implanting dopant through the another first mask;
and forming the another second mask with the well pattern and the adjusted alignment over the second substrate.

8. The method of claim 1, wherein the substrate comprises silicon; the epitaxial layer comprises silicon; and the epitaxial layer is formed with a monocrystalline silicon structure over the first buried layer and as a polycrystalline silicon structure over the second buried layer.

9. The method of claim 8, wherein the epitaxial layer is selectively removed from over the layer of insulating material by etching the polycrystalline silicon structure with an aqueous solution of choline hydroxide.

10. The method of claim 1, wherein the layer of insulating material comprises silicon nitride.

11. A method of fabricating an integrated circuit, comprising:
providing a substrate with a first region and a second region;
forming a hard mask layer with a buried layer pattern over the substrate, the hard mask layer including a first opening over the first region and a second opening over the second region;
forming a buried layer in at least the first region by implanting dopant into the substrate at least through the first opening;
forming a layer of insulating material over the hard mask layer including in the second opening;
selectively removing the layer of insulating material and the hard mask layer from over the first region, leaving the hard mask second opening and layer of insulating material in the second opening over the second region;
after selectively removing the insulating material and the hard mask layer, forming an epitaxial layer over the first and second regions of the substrate;
selectively removing the epitaxial layer from over the hard mask second opening and from over layer of insulating material in the second opening, leaving the epitaxial layer over the first region;
after selectively removing the epitaxial layer, forming a mask with a well pattern over the epitaxial layer, including over the buried layer and over the layer of insulating material in the second opening; and
determining an alignment of the well pattern with the buried layer by measuring an alignment of the well pattern with the layer of insulating material in the second opening.

12. The method of claim 11, wherein the hard mask layer comprises an oxide.

13. The method of claim 12, wherein the layer of insulating material comprises a nitride.

14. The method of claim 13, wherein the substrate comprises silicon; the epitaxial layer comprises silicon; and the epitaxial layer is formed with a monocrystalline silicon structure over the buried layer and as a polycrystalline silicon structure over the second buried layer.

15. The method of claim 14, further comprising adjusting an alignment of another mask with the well pattern based on determining the alignment of the mask with the well pattern.

16. The method of claim 15, further comprising providing a different substrate; forming another hard mask with the buried layer pattern over the different substrate; forming another buried layer in the different substrate by implanting dopant through the another hard mask; and forming the another mask with the well pattern and the adjusted alignment over the different substrate.

17. A method of fabricating an integrated circuit, comprising:
forming doped buried layers in an integrated circuit region and in a monitor region of a semiconductor substrate by implanting dopant into areas of a semiconductor substrate exposed by masking with a buried layer pattern;
selectively forming a layer of intervening material over the implanted monitor region and not over the implanted integrated circuit region;
forming an epitaxial layer comprising a monocrystalline layer of semiconductor material over the integrated circuit region, and a polycrystalline layer of the semiconductor material over the intervening layer over the monitor region;
removing the polycrystalline layer of the semiconductor material to expose the intervening layer over the monitor region, leaving the monocrystalline layer over the integrated circuit region;
after removing the polycrystalline layer of semiconductor material, forming a well implant pattern over the monocrystalline layer in the integrated circuit region and over the intervening material layer in the monitor region;
measuring spacing of the well implant pattern over the intervening material layer to determine lateral alignment of the well implant pattern to the buried layers.

18. The method of claim 17 further comprising using the determined lateral alignment to adjust the position of the well implant pattern of the same or a different substrate.

19. The method of claim 17 wherein the semiconductor material comprises silicon; and the intervening material is a nitride.

20. A method of fabricating an integrated circuit, comprising:
forming a first oxide layer over an integrated circuit region and over a monitor region of a silicon substrate of given conductivity type;
forming a first photoresist layer with a buried layer pattern over the first oxide layer;
transferring the buried layer pattern from the photoresist to the first oxide layer;
forming buried layers of opposite conductivity type in the integrated circuit region and in the monitor region by implanting dopant into areas of the silicon substrate exposed by the buried layer pattern in the first oxide layer;
conducting an anneal operation to diffuse the implanted dopant and to form a second oxide layer over the exposed areas of the silicon substrate;
forming a nitride layer over the patterned first oxide layer and over the second oxide layer;
selectively removing the nitride layer, the second oxide layer and the first oxide layer from over the integrated circuit region, leaving the nitride layer, the second oxide layer and the first oxide layer over the monitor region;

forming an epitaxial layer comprising a monocrystalline silicon layer over the integrated circuit region, and a polycrystalline silicon layer over the nitride layer over the monitor region;

selectively removing the polycrystalline silicon layer to expose the nitride layer over the monitor region, leaving the monocrystalline silicon layer over the integrated circuit region;

forming a second photoresist layer with a well implant pattern over the monocrystalline silicon layer in the integrated circuit region and over the nitride layer in the monitor region;

measuring spacing of the well implant pattern of the second photoresist layer over the nitride layer to determine lateral alignment of the well implant pattern to the buried; and using the determined lateral alignment to adjust the position of the well implant pattern of the same or a different substrate.

21. The method of claim 20 wherein the substrate is a wafer; and the first oxide layer is also formed over a backside of the wafer.

* * * * *